United States Patent
Liman et al.

(10) Patent No.: US 12,360,062 B1
(45) Date of Patent: Jul. 15, 2025

(54) METHODS AND SYSTEMS FOR REGULARIZING THE OPTIMIZATION OF APPLICATION SPECIFIC SEMICONDUCTOR MEASUREMENT SYSTEM PARAMETER SETTINGS

(71) Applicant: KLA Corporation, Milpitas, CA (US)

(72) Inventors: Christopher D. Liman, Milpitas, CA (US); Bindi M. Nagda, Melbourne, FL (US); Antonio Arion Gellineau, Santa Clara, CA (US)

(73) Assignee: KLA Corporation, Milpitas, CA (US)

( * ) Notice: Subject to any disclaimer, the term of this patent is extended or adjusted under 35 U.S.C. 154(b) by 375 days.

(21) Appl. No.: 17/828,461

(22) Filed: May 31, 2022

Related U.S. Application Data

(60) Provisional application No. 63/294,841, filed on Dec. 29, 2021.

(51) Int. Cl.
*G06F 11/30* (2006.01)
*G01N 23/20008* (2018.01)

(52) U.S. Cl.
CPC . *G01N 23/20008* (2013.01); *G01N 2223/304* (2013.01)

(58) Field of Classification Search
CPC .............. G01N 23/20008; G01N 2223/304
See application file for complete search history.

(56) References Cited

U.S. PATENT DOCUMENTS

| | | | |
|---|---|---|---|
| 5,608,526 | A | 3/1997 | Piwonka-Corle et al. |
| 5,859,424 | A | 1/1999 | Norton et al. |
| 6,023,338 | A | 2/2000 | Bareket |
| 6,429,943 | B1 | 8/2002 | Opsal et al. |

(Continued)

FOREIGN PATENT DOCUMENTS

WO    WO-2009007981 A1 *  1/2009  ......... G01B 11/0625

OTHER PUBLICATIONS

Emaillet, Germer, Kline et al., "Intercomparison between optical and x-ray scatterometry measurements of FinFET structures" by Proc. SPIE, v.8681, p. 86810Q (2013).

(Continued)

*Primary Examiner* — Phuong Huynh
(74) *Attorney, Agent, or Firm* — Spano Law Group

(57) ABSTRACT

Methods and systems for optimizing a semiconductor measurement recipe that is robust to variations of hardware modeling parameters and geometric modeling errors are described herein. Robust measurement recipe optimization minimizes a cost function including one or more regularization terms that constrain the process space, and thus, significantly reduces the computational effort required to optimize a measurement recipe. This reduces overall process time and improves wafer throughput. In some examples, optimization is performed based on measurement data associated with multiple instances of a semiconductor structure; each instance characterized a different value of one or more geometric parameters of interest. In some examples, the search for optimized measurement recipes is limited to the discrete set of measurement system parameter values associated with the available measurement data set. In this manner, the performance of a particular measurement recipe is validated using existing measurement data.

23 Claims, 8 Drawing Sheets

(56) References Cited

U.S. PATENT DOCUMENTS

| | | |
|---|---|---|
| 6,716,646 B1 | 4/2004 | Wright et al. |
| 6,778,275 B2 | 8/2004 | Bowes |
| 6,787,773 B1 | 9/2004 | Lee |
| 6,992,764 B1 | 1/2006 | Yang et al. |
| 7,242,477 B2 | 7/2007 | Mieher et al. |
| 7,321,426 B1 | 1/2008 | Poslavsky et al. |
| 7,406,153 B2 | 7/2008 | Berman |
| 7,478,019 B2 | 1/2009 | Zangooie et al. |
| 7,626,702 B2 | 12/2009 | Ausschnitt et al. |
| 7,656,528 B2 | 2/2010 | Abdulhalim et al. |
| 7,826,071 B2 | 11/2010 | Shchegrov et al. |
| 7,842,933 B2 | 11/2010 | Shur et al. |
| 7,873,585 B2 | 1/2011 | Izikson |
| 7,929,667 B1 | 4/2011 | Zhuang et al. |
| 7,933,026 B2 | 4/2011 | Opsal et al. |
| 8,068,662 B2 | 11/2011 | Zhang et al. |
| 8,138,498 B2 | 3/2012 | Ghinovker |
| 9,291,554 B2 | 3/2016 | Kuznetsov et al. |
| 9,826,614 B1 | 11/2017 | Bakeman et al. |
| 9,885,962 B2 | 2/2018 | Veldman et al. |
| 9,915,522 B1 | 3/2018 | Jiang et al. |
| 10,013,518 B2 | 7/2018 | Bakeman et al. |
| 10,101,670 B2 | 10/2018 | Pandev et al. |
| 10,152,678 B2 | 12/2018 | Pandev et al. |
| 10,324,050 B2 | 6/2019 | Hench et al. |
| 10,352,695 B2 | 7/2019 | Dziura et al. |
| 2003/0021465 A1 | 1/2003 | Adel et al. |
| 2005/0128489 A1* | 6/2005 | Bao .................. G01B 11/303 356/601 |
| 2006/0126079 A1* | 6/2006 | Bareket ............... G01N 21/956 356/625 |
| 2007/0176128 A1 | 8/2007 | Van Bilsen et al. |
| 2007/0221842 A1 | 9/2007 | Morokuma et al. |
| 2009/0152463 A1 | 6/2009 | Toyoda et al. |
| 2011/0266440 A1 | 11/2011 | Boughorbel et al. |
| 2012/0292502 A1 | 11/2012 | Langer et al. |
| 2013/0208279 A1 | 8/2013 | Smith |
| 2013/0304424 A1 | 11/2013 | Bakeman et al. |
| 2014/0019097 A1 | 1/2014 | Bakeman et al. |
| 2014/0064445 A1 | 3/2014 | Adler |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0297211 A1 | 10/2014 | Pandev et al. |
| 2014/0340682 A1* | 11/2014 | Kwak .................. G01N 21/274 356/369 |
| 2015/0046121 A1 | 2/2015 | Dziura et al. |
| 2015/0110249 A1 | 4/2015 | Bakeman et al. |
| 2015/0117610 A1 | 4/2015 | Veldman et al. |
| 2015/0204664 A1 | 7/2015 | Bringoltz et al. |
| 2015/0285749 A1 | 10/2015 | Moncton et al. |
| 2015/0300965 A1 | 10/2015 | Sezginer et al. |
| 2016/0202193 A1 | 7/2016 | Hench et al. |
| 2016/0320319 A1 | 11/2016 | Hench et al. |
| 2017/0023491 A1* | 1/2017 | Cao .................... G03F 7/70625 |
| 2017/0167862 A1 | 6/2017 | Dziura et al. |
| 2018/0106735 A1 | 4/2018 | Gellineau et al. |
| 2018/0113084 A1 | 4/2018 | Hench et al. |
| 2018/0328868 A1 | 11/2018 | Bykanov et al. |
| 2019/0017946 A1 | 1/2019 | Wack et al. |
| 2019/0293578 A1 | 9/2019 | Gellineau |
| 2020/0025554 A1 | 1/2020 | Gellineau et al. |
| 2021/0207956 A1 | 7/2021 | Shchegrov et al. |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).
International Search Report mailed on Mar. 3, 2023, for PCT Application No. PCT/US2022/049179 filed on Nov. 8, 2022 by KLA Corporation, 3 pages.

* cited by examiner

METHODS AND SYSTEMS FOR REGULARIZING THE OPTIMIZATION OF APPLICATION SPECIFIC SEMICONDUCTOR MEASUREMENT SYSTEM PARAMETER SETTINGS

CROSS REFERENCE TO RELATED APPLICATION

The present application for patent claims priority under 35 U.S.C. § 119 from U.S. provisional patent application Ser. No. 63/294,841, entitled "Methods for using regularization to increase time efficiency of metrology," filed Dec. 29, 2021, the subject matter of which is incorporated herein by reference in its entirety.

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

Traditionally, scatterometry critical dimension (SCD) measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. Optical metrology tools utilizing infrared to visible light can penetrate many layers of translucent materials, but longer wavelengths that provide good depth of penetration do not provide sufficient sensitivity to small anomalies. In addition, the increasing number of parameters required to characterize complex structures (e.g., FinFETs), leads to increasing parameter correlation. As a result, the parameters characterizing the target often cannot be reliably decoupled.

In one example, longer wavelengths (e.g. near infrared) have been employed in an attempt to overcome penetration issues for 3D FLASH devices that utilize polysilicon as one of the alternating materials in the stack. However, the mirror like structure of 3D FLASH intrinsically causes decreasing light intensity as the illumination propagates deeper into the film stack. This causes sensitivity loss and correlation issues at depth. In this scenario, SCD is only able to successfully extract a reduced set of metrology dimensions with high sensitivity and low correlation.

In another example, opaque, high-k materials are increasingly employed in modern semiconductor structures. Optical radiation is often unable to penetrate layers constructed of these materials. As a result, measurements with thin-film scatterometry tools such as ellipsometers or reflectometers are becoming increasingly challenging.

In response to these challenges, more complex optical metrology tools have been developed. For example, tools with multiple angles of illumination, shorter illumination wavelengths, broader ranges of illumination wavelengths, and more complete information acquisition from reflected signals (e.g., measuring multiple Mueller matrix elements in addition to the more conventional reflectivity or ellipsometric signals) have been developed. In addition, X-Ray scatterometry systems, such as transmission, small angle x-ray scatterometry (T-SAXS) systems, have shown promise to address challenging measurement applications. These X-Ray based scatterometry systems also feature large ranges of illumination angles, broad ranges of illumination wavelengths, etc. Although state of the art optical and X-ray scatterometry systems enable challenging measurement applications, timely measurement recipe generation has emerged as a limiting performance issue.

Measurement recipe optimization is a critical aspect of scatterometry. A measurement recipe identifies the set of measurement system settings (e.g., particular wavelengths, angles of incidence, azimuth angles, exposure times, etc.) employed to estimate a structural parameter of interest (e.g., critical dimension, film thickness, material composition, etc.). Ideally, a measurement recipe should include the minimum number of different measurements required to estimate a parameter of interest to maximize measurement throughput. Modern scatterometry tools offer wide ranges of measurement system parameters (e.g., angles of incidence, wavelengths, etc.). This complicates recipe generation because there are so many different measurement system parameter values available. Moreover, there is limited time to perform useful measurements. Thus, the time required to generate a measurement recipe for a particular measurement application is critical.

The time to generate a measurement recipe is especially critical for measurement technologies that require relatively long periods of time for each measurement. For example, some T-SAXS measurements suffer from low brightness and low scattering cross-sections. Hence, these measurements have long acquisition times. In some examples, the measurement model associated with a T-SAXS measurement is complex and a long compute time is required to solve the model.

An idealized measurement of a semiconductor structure is performed over the complete range of available measurement system settings (e.g., angles of incidence, azimuth angle, beam divergence, wavelengths, exposure time, etc.). Data associated with measurements of a semiconductor structure at each combination of available measurement system settings is collected over relatively long exposure times and analyzed to arrive at an estimated value of a parameter of interest that characterizes the structure under measurement. Such an idealized measurement is impractical with modern scatterometry tools. The time required to perform measurements of a metrology target over the entire breadth of measurement options is impractically long. Moreover, the photon dosage required to perform such an exhaustive set of measurements threatens the integrity of the structures under measurement.

Currently, measurement recipe generation begins by identifying a relatively large number of different measurements associated with a particular measurement application, performing all of the measurements, and then generating an improved measurement recipe. For example, a relatively large set of measurements each with different system settings (i.e., different system parameter values) is identified. Measurements of one or more structures are then performed at each of the different prescribed metrology system settings. The measurement data associated with all of the measurements is collected and analyzed to generate an improved measurement recipe (i.e., a subset or different set of measurements).

This approach is applied iteratively to arrive at a satisfactory measurement recipe. At each iteration, the new set of measurements is applied to another lot of wafers. If a given measurement recipe is inadequate, the improved measurement recipe is applied to the next lot of wafers. As a result, process shifts can trigger long periods (e.g., several weeks) of iterative recipe optimization before the metrology system provides value. For slower tools (e.g., photon starved tools), this approach to recipe optimization creates unacceptable delays.

In some examples, a relatively large number of different measurements associated with a particular measurement application are simulated and a measurement recipe is generated based on a tradeoff between measurement performance and acquisition time. Examples of implementing automatic tradeoffs between performance and acquisition time are described in U.S. Patent Publication No. 2020/0025554, and U.S. Patent Publication No. 2019/0293578, the content of each is incorporated herein by reference in its entirety.

Conventional measurement recipe optimization based on a measurement performance metric identifies an optimal measurement recipe for a single, simulated geometric structure with prescribed assumptions about parameter errors. Exemplary parameter errors include errors associated with system parameters, e.g., hardware tolerances and errors associated with geometric parameters employed to characterize the geometric structure under measurement.

Unfortunately, conventional measurement recipe optimization suffers from a lack of robustness. For example, if the range of actual structures to be measured varies significantly from the simulated structure employed to generate the measurement recipe, the performance of the optimized measurement recipe meaningfully degrades.

Future metrology applications present challenges for metrology due to increasingly small resolution requirements, multi-parameter correlation, increasingly complex geometric structures, and increasing use of opaque materials. Thus, methods and systems for improved measurement recipe generation are desired.

SUMMARY

Methods and systems for optimizing a semiconductor measurement recipe that is robust to variations of hardware modeling parameters and geometric modeling errors are described herein. A robust measurement recipe identifies a minimum set of measurement system settings that meets wafer throughput and measurement uncertainty requirements despite uncertainty in measurement system errors, geometric modeling errors, and the underlying geometry of the structures under measurement.

Robust measurement recipe optimization minimizes a cost function that not only includes terms characterizing measurement performance and exposure time, but also one or more regularization terms that constrain the process space explored during the optimization. By increasing optimization robustness and reducing bias to specific sets of simulated model parameter values using regularization as described herein, fewer sets of simulated model parameter values are required. This significantly reduces the computational effort required to optimize a measurement recipe.

In general, the regularized measurement recipe optimization described herein may include any method of performance estimation, including error propagation, machine learning, regression, etc. By introducing a cost to the evaluation of the available points in a process space, regularization, as described herein, increases measurement recipe robustness and reduces total measurement process time.

The optimized set of measurement system parameter values describes a sequence of measurements of a semiconductor structure by a metrology system at each of the one or more measurement sites. Each measurement of the sequence of measurements is characterized by a different value of one or more metrology system parameters that define a configuration of the metrology system. In other words, the measurement system configuration (e.g., angle of incidence, divergence, azimuth angle, beam energy, integration time, etc., is different for each measurement of the sequence of measurements).

In one aspect, a regularized measurement recipe optimization cost function includes a regularization term characterizing the roughness of a curve expressing exposure time as a function of angle of incidence.

In another aspect, a regularized measurement recipe optimization cost function includes a regularization term characterizing the asymmetry of a curve expressing exposure time as a function of angle of incidence.

In another aspect, a regularized measurement recipe optimization cost function includes a regularization term characterizing differences between a current measurement recipe and a reference measurement recipe.

In another aspect, a regularized measurement recipe optimization cost function includes a regularization term characterizing differences between a current value of a measurement system parameter prescribed by the current measurement recipe and a reference measurement system parameter value.

In general, a regularized cost function may include any number of regularization terms, e.g., any combination of the regularization terms described herein.

In a further aspect, regularized measurement recipe optimization is performed based on measurement data associated with multiple instances of a semiconductor structure each characterized a different value of one or more geometric parameters of interest. In this manner, the measurement data includes measurements of the semiconductor structure at multiple different nominal values of the geometric parameters characterizing the geometry of the structure.

In some embodiments, the value of a regularized cost function associated with a measurement recipe optimization is determined for each instance of the semiconductor structure. The resulting values of the regularized cost function are averaged, and the average value of the regularized cost function is employed to drive the next iteration of the measurement recipe. By averaging the values of the regularized cost function associated with a range of different instances of a semiconductor structure performance, the optimized measurement recipe is more robust to variations of the geometry of the structure under measurement.

In general, a regularization term may be synthesized and employed as an element of the cost function of a measurement recipe optimization based on any known characteristics of the structure under measurement including, but not limited to, symmetry, optical density, height, and class of the structure. In addition, a regularization term may be synthesized and employed as an element of the cost function of a measurement recipe optimization based on the particular parameter of interest, e.g., CD, tilt, etc.

In a further aspect, the search for optimized measurement recipes is limited to the discrete set of measurement system parameter values associated with the available measurement data set. Thus, an optimized measurement recipe is a discrete subset of the measurement system parameter values associated with the available measurement data set. In this manner, the performance of a particular measurement recipe can be validated using existing measurement data.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for selecting a subset of available semiconductor measurement system settings optimized to a particular measurement application and robust to variations of hardware modeling parameters (e.g., flux, beam center, etc.) and geometric modeling errors are described herein.

A metrology tool includes a wide array of measurement options. Measurement performance varies for each measurement option and measurement application. A robust measurement recipe identifies a minimum set of measurement system settings that meets wafer throughput and measurement uncertainty requirements despite uncertainty in measurement system errors, geometric modeling errors, and the underlying geometry of the structures under measurement.

Robust measurement recipe optimization minimizes a cost function that not only includes terms characterizing measurement performance and exposure time, but also one or more regularization terms that constrain the process space explored during the optimization. The regularization terms are formulated to incorporate prior knowledge of the measurement application to expedite robust measurement recipe optimization. Furthermore, regularization reduces uncertainty over the entire space of possible geometric variations by mitigating the bias of the recipe optimization to specific nominal parameter values. By increasing optimization robustness and reducing bias to specific sets of simulated model parameter values using regularization as described herein, fewer sets of simulated model parameter values are required. This significantly reduces the computational effort required to optimize a measurement recipe.

Overall measurement process time includes both measurement time and measurement recipe optimization time. Recipe optimization time increases dramatically if all possible measurement system parameter settings are considered in the optimization. Furthermore, measurement time dramatically increases if long exposure times over a large number of different measurement system parameter settings are required. Incorporating prior knowledge of the structure under measurement by regularizing the recipe optimization reduces bias in the optimized recipe resulting in a more optimal choice of system parameters with a lower measurement time. This reduces both measurement time and recipe optimization time.

In general, the regularized measurement recipe optimization described herein may include any method of performance estimation, including error propagation, machine learning, regression, etc. By introducing a cost to the evaluation of the available points in a process space, regularization, as described herein, increases measurement recipe robustness and reduces total measurement process time.

Figure 1:
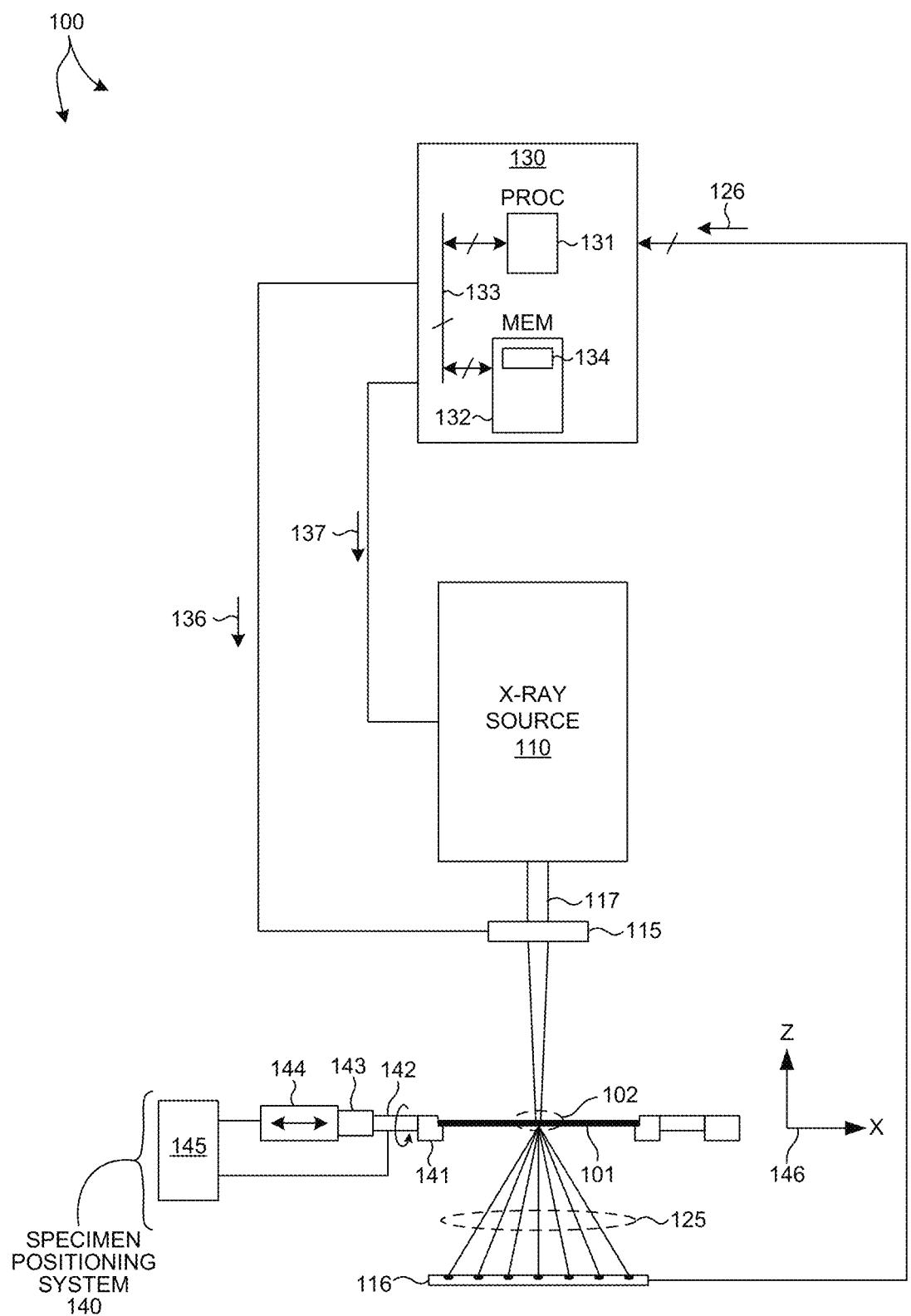
FIG. 1 is a diagram illustrative of a metrology system 100 configured to measure characteristics of a specimen in accordance with the methods described herein.

FIG. 1 illustrates an embodiment of a metrology tool 100 for measuring characteristics of a specimen in accordance with the exemplary methods presented herein. As shown in FIG. 1, the system 100 may be used to perform x-ray scatterometry measurements over an inspection area 102 of a specimen 101 disposed on a specimen positioning system 140.

In the depicted embodiment, metrology tool 100 includes an x-ray illumination source 110 configured to generate x-ray radiation suitable for x-ray scatterometry measurements. In some embodiments, the x-ray illumination system 110 is configured to generate wavelengths between 0.01 nanometers and 1 nanometer. X-ray illumination source 110 produces an x-ray beam 117 incident on inspection area 102 of specimen 101.

In general, any suitable high-brightness x-ray illumination source capable of generating high brightness x-rays at flux levels sufficient to enable high-throughput, inline metrology may be contemplated to supply x-ray illumination for x-ray scatterometry measurements. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV are employed to ensure that the x-ray source supplies light at wavelengths that allow sufficient transmission through the entire device as well as the wafer substrate. By way of non-limiting example, any of a particle accelerator source, a liquid anode source, a rotating anode source, a stationary, solid anode source, a microfocus source, a microfocus rotating anode source, and an inverse Compton source may be employed as x-ray source 110. In one example, an inverse Compton source available from Lyncean Technologies, Inc., Palo Alto, California (USA) may be contemplated. Inverse Compton sources have an additional advantage of being able to produce x-rays over a range of photon energies, thereby enabling the x-ray source to deliver x-ray radiation at different, selectable wavelengths.

Figure 2:
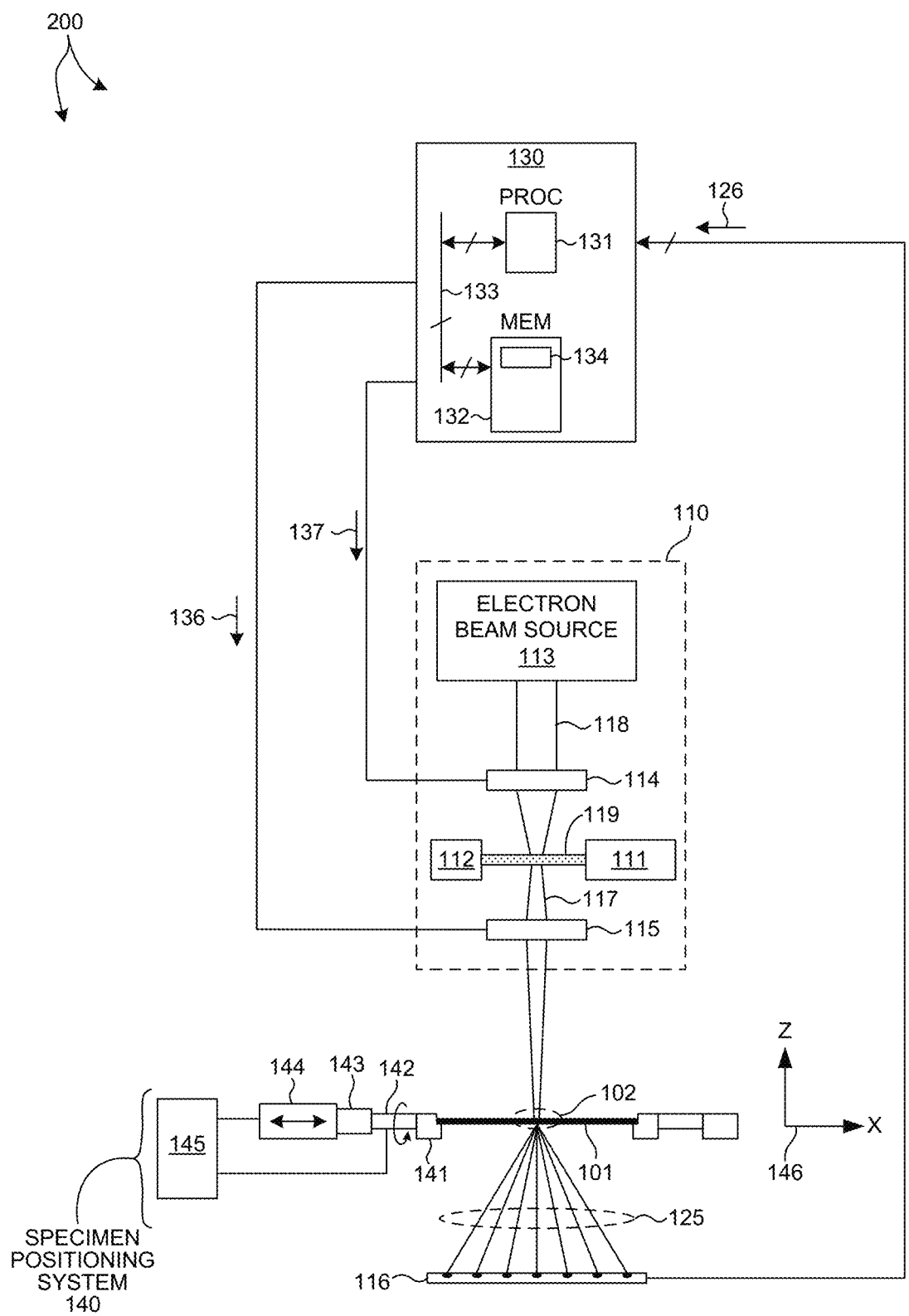
FIG. 2 is a diagram illustrative of a metrology tool 200 in another embodiment configured to measure characteristics of a specimen in accordance with the methods presented herein.

Exemplary x-ray sources include electron beam sources configured to bombard solid or liquid targets to stimulate x-ray radiation. FIG. 2 depicts a metrology tool 200 for measuring characteristics of a specimen in accordance with the exemplary methods presented herein. Like numbered elements of metrology tool 100 and 200 are analogous. However, in the embodiment depicted in FIG. 2, x-ray illumination source 110 is a liquid metal based x-ray illumination system. A jet of liquid metal 119 is produced from a liquid metal container 111 and collected in a liquid metal collector 112. A liquid metal circulation system (not shown) returns liquid metal collected by collector 112 to liquid metal container 111. The jet of liquid metal 119 includes one or more elements. By way of non-limiting example, the jet of liquid metal 119 includes any of Aluminum, Gallium, Indium, Tin, Thallium, and Bismuth. In this manner, the jet of liquid metal 119 produces x-ray lines corresponding with its constituent elements. In one embodiment, the jet of liquid metal includes a Gallium and Indium alloy. In some embodiments, the x-ray illumination system 110 is configured to generate wavelengths between 0.01 nanometers and 1 nanometer. An electron beam source 113 (e.g., electron gun) produces a stream of electrons 118 that is directed by electron optics 114 to the jet of liquid metal 119. Suitable electron optics 114 includes electromagnets, permanent magnets, or a combination of electromagnets and permanent magnets for focusing the electron beam and directing the beam at the liquid metal jet. The coincidence of the jet of liquid metal 119 and the stream of electrons 118 produces an x-ray beam 117 incident on inspection area 102 of specimen 101.

Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

In one embodiment, the incident x-ray beam 117 is at the Indium kα line of 24.2 keV. The x-ray beam is collimated down to less than one milliradian divergence using multilayer x-ray optics for x-ray scatterometry measurements.

In some embodiments, x-ray scattering measurements described herein are achieved without using a screen located between the x-ray source and the specimen under measurement. In these embodiments, the measured intensities of the incident beam over a range of angles of incidence, multiple wavelengths, or a combination of both, provide sufficient information to resolve a distribution map (i.e., image) of a desired material property (e.g., complex refractive index, electron density, or absorptivity) of the measured structure. However, in some other examples, a pinhole or another aperture is located on an otherwise opaque screen that is located between the x-ray source and the specimen under measurement to improve collimation of the x-ray beam. The intensity of the diffraction pattern is measured for several positions of the aperture. In some other embodiments, a screen with a pseudo-random aperture pattern is used, and the diffraction pattern is measured for multiple screens. These approaches may also be contemplated to provide additional information to resolve the three-dimensional distribution of the desired material property of the measured structure.

In some embodiments, the profile of the incident x-ray beam is controlled by two or more apertures, slits, or a combination thereof. In a further embodiment, the apertures, slits, or both, are configured to rotate in coordination with the orientation of the specimen to optimize the profile of the incident beam for each angle of incidence, azimuth angle, or both.

As depicted in FIG. 1, x-ray optics 115 shape and direct incident x-ray beam 117 to specimen 101. In some examples, x-ray optics 115 include an x-ray monochromator to monochromatize the x-ray beam that is incident on the specimen 101. In one example, a crystal monochromator such as a Loxley-Tanner-Bowen monochromator is employed to monochromatize the beam of x-ray radiation. In some examples, x-ray optics 115 collimate or focus the x-ray beam 117 onto inspection area 102 of specimen 101 to less than 1 milliradian divergence using multilayer x-ray optics. In some embodiments, x-ray optics 115 includes one or more x-ray collimating mirrors, x-ray apertures, x-ray beam stops, refractive x-ray optics, diffractive optics such as zone plates, specular x-ray optics such as grazing incidence ellipsoidal mirrors, polycapillary optics such as hollow capillary x-ray waveguides, multilayer optics, or systems, or any combination thereof. Further details are described in U.S. Patent Publication No. 2015/0110249, the content of which is incorporated herein by reference it its entirety.

In general, the focal plane of the illumination optics system is optimized for each measurement application. In this manner, system 100 is configured to locate the focal plane at various depths within the specimen depending on the measurement application.

X-ray detector 116 collects x-ray radiation 125 scattered from specimen 101 and generates an output signal 126 indicative of properties of specimen 101 that are sensitive to the incident x-ray radiation in accordance with an x-ray scatterometry measurement modality. In some embodiments, scattered x-rays 125 are collected by x-ray detector 116 while specimen positioning system 140 locates and orients specimen 101 to produce angularly resolved scattered x-rays.

In some embodiments, an x-ray scatterometry system includes one or more photon counting detectors with high dynamic range (e.g., greater than $10^5$) and thick, highly absorptive crystal substrates that absorb the direct beam (i.e., zero order beam) without damage and with minimal parasitic backscattering. In some embodiments, a single photon counting detector detects the position and number of detected photons.

Full beam x-ray scatterometry requires collection of the zero order beam along with higher diffraction orders. The zero order beam is several orders of magnitude more intense than the other orders. If the zero order beam is not fully absorbed in the X-Ray sensitive section of the detector, it will scatter and generate parasitic signals. The strength of these parasitic signals limits the dynamic range of the measurement. For example, if the parasitic signal is 10-4 of the largest flux signal (i.e., the zero order signal), the signals associated with many higher orders will be contaminated. Thus, it is critical that the detector (e.g., detector 116) exhibit high conversion efficiency of X-rays to electron hole pairs and high X-ray absorption to increase the effective dynamic range of the full beam metrology.

Exemplary detector materials suitable for full beam x-ray scatterometry include Cadmium Telluride (CdTe), Germanium (Ge) and Gallium Arsenide (GaAs) crystals, and others. In some embodiments, the detector material is selected to provide high conversion efficiency in a narrow energy band corresponding to the source energy.

In some embodiments, the thickness of the detector material is selected to achieve the desired absorption of incoming X-rays. In some embodiments, the detector is tilted with respect to the incoming X-ray beams (the various diffraction orders) to increase the path length of the X-ray beams through the detector material, and thus, increase the total amount of absorption.

In some embodiments, dual threshold detectors are employed to improve SNR.

In some embodiments, the x-ray detector resolves one or more x-ray photon energies and produces signals for each x-ray energy component indicative of properties of the specimen. In some embodiments, the x-ray detector 116 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 126 for further processing and storage.

In some embodiments, the detector is scanned relative to the incoming X-rays to mitigate damage or excessive charging from the incident zero order beam. In some of these embodiments, the detector is continuously scanned with respect to the incoming X-rays to avoid having the zero order beam dwell on a particular location on the detector surface for an extended period of time. In some other embodiments, the detector is periodically moved with respect to the incoming X-rays to avoid having the zero order beam dwell on a particular location on the detector surface for an extended period of time. In some embodiments, the scanning or periodic movements are approximately perpendicular to the incoming X-rays. In some embodiments, the movements are rotational (e.g., the detector is rotated such that a particular location on the detector surface traces out a circle in space). In some embodiments, the movements are a combination of translational movements that move the point of incidence of the zero order beam to various different locations on the detector surface.

In an x-ray scatterometry measurement, a structure (e.g., a high aspect ratio, vertically manufactured structure) diffracts a collimated X-ray beam into diffraction orders. Each diffraction order travels in a particular, predictable direction. The angular spacing of the diffraction orders is inversely proportional to the lattice constant of the specimen divided by the wavelength. The diffraction orders are detected by a detector array placed at some distance from the wafer. Each pixel of the detector outputs a signal that indicates the number of photons that hit the pixel.

The intensities of diffraction orders are of the form I(m, n, $\theta$, $\phi$, $\lambda$), where $\{m, n\}$ are integer indices of diffraction orders, $\{\theta, \phi\}$ are elevation and azimuth angles of the incident beam (i.e., polar coordinates of the incident chief ray with respect to a coordinate system that is fixed to the wafer), and $\lambda$ is the wavelength of the incident X-ray.

Several noise sources perturb the illumination light as it exits the illumination and propagates toward the specimen. Exemplary disturbances include electron beam current fluctuation, temperature induced optic drift, etc. The perturbed incident flux is denoted as $F_0(1+n_1)$.

The target scatters the incident radiation in a manner that depends on the azimuth and elevation angles of the incident beam. The efficiency of light scattering into orders (m,n) can be defined as $S_{mn}(\theta, \phi)$. As the diffracted light propagates from the specimen to the detector, the beam passes through other scattering media that affect all orders similarly with some variation $(1+n_2)$ and parasitic noise $(n_3)$. In this manner the total intensity $I_{mn}$ of each order measured in a time, t, can be expressed by equation (1).

$$I_{mn} = S_{mn}(\theta,\phi)(1+n_2)(1+n_1)F_0 t + n_3 \qquad (1)$$

In some embodiments, it is desirable to perform measurements at different orientations described by rotations about the x and y axes indicated by coordinate system 146 depicted in FIG. 1. This increases the precision and accuracy of measured parameters and reduces correlations among parameters by extending the number and diversity of data sets available for analysis to include a variety of large-angle, out of plane orientations. Measuring specimen parameters with a deeper, more diverse data set also reduces correlations among parameters and improves measurement accuracy. For example, in a normal orientation, x-ray scatterometry is able to resolve the critical dimension of a feature, but is largely insensitive to sidewall angle and height of a feature. However, by collecting measurement data over a broad range of out of plane angular positions, the sidewall angle and height of a feature can be resolved.

As illustrated in FIG. 1, metrology tool 100 includes a specimen positioning system 140 configured to both align specimen 101 and orient specimen 101 over a large range of out of plane angular orientations with respect the scatterometer. In other words, specimen positioning system 140 is configured to rotate specimen 101 over a large angular range about one or more axes of rotation aligned in-plane with the surface of specimen 101. In some embodiments, specimen positioning system 140 is configured to rotate specimen 101 within a range of at least 90 degrees about one or more axes of rotation aligned in-plane with the surface of specimen 101. In some embodiments, specimen positioning system is configured to rotate specimen 101 within a range of at least 120 degrees about one or more axes of rotation aligned in-plane with the surface of specimen 101. In some other embodiments, specimen positioning system is configured to rotate specimen 101 within a range of at least one degree about one or more axes of rotation aligned in-plane with the surface of specimen 101. In this manner, angle resolved measurements of specimen 101 are collected by metrology system 100 over any number of locations on the surface of specimen 101. In one example, computing system 130 communicates command signals to motion controller 145 of specimen positioning system 140 that indicate the desired position of specimen 101. In response, motion controller 145 generates command signals to the various actuators of specimen positioning system 140 to achieve the desired positioning of specimen 101.

By way of non-limiting example, as illustrated in FIG. 1, specimen positioning system 140 includes an edge grip chuck 141 to fixedly attach specimen 101 to specimen positioning system 140. A rotational actuator 142 is configured to rotate edge grip chuck 141 and the attached specimen 101 with respect to a perimeter frame 143. In the depicted embodiment, rotational actuator 142 is configured to rotate specimen 101 about the x-axis of the coordinate system 146 illustrated in FIG. 1. As depicted in FIG. 1, a rotation of specimen 101 about the z-axis is an in plane rotation of specimen 101. Rotations about the x-axis and the y-axis (not shown) are out of plane rotations of specimen 101 that effectively tilt the surface of the specimen with respect to the metrology elements of metrology system 100. Although it is not illustrated, a second rotational actuator is configured to rotate specimen 101 about the y-axis. A linear actuator 144 is configured to translate perimeter frame 143 in the x-direction. Another linear actuator (not shown) is configured to translate perimeter frame 143 in the y-direction. In this manner, every location on the surface of specimen 101 is available for measurement over a range of out of plane angular positions. For example, in one embodiment, a location of specimen 101 is measured over several angular increments within a range of −45 degrees to +45 degrees with respect to the normal orientation of specimen 101.

In general, specimen positioning system 140 may include any suitable combination of mechanical elements to achieve the desired linear and angular positioning performance, including, but not limited to goniometer stages, hexapod stages, angular stages, and linear stages.

Figure 3:
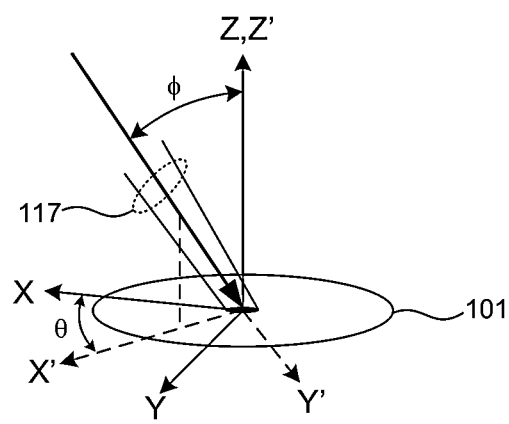
FIG. 3 depicts x-ray illumination beam 117 incident on wafer 101 at a particular orientation described by angles $\phi$ and $\theta$.

As described herein, x-ray scatterometry measurements are performed at multiple orientations of the illuminating x-ray beam relative to the surface normal of the semiconductor wafer. Each orientation is described by any two angular rotations of wafer 101 with respect to the x-ray illumination beam, or vice-versa. In one example, the orientation can be described with respect to a coordinate system fixed to the wafer. FIG. 3 depicts x-ray illumination beam 117 incident on wafer 101 at a particular orientation described by angles ϕ and θ. Coordinate frame XYZ is fixed the metrology system and coordinate frame X'Y'Z' is fixed to wafer 101. Z is aligned with an axis normal to the surface of wafer 101. X and Y are in a plane aligned with the surface of wafer 101. Similarly, Z' is aligned with an axis normal to the surface of wafer 101, and X' and Y' are in a plane aligned with the surface of wafer 101. As depicted in FIG. 3, x-ray illumination beam 117 lies within the X'Z' plane. Angle, ϕ, describes the orientation of the x-ray illumination beam 117 with respect to the surface normal of the wafer in the X'Z' plane. Furthermore, angle, θ, describes the orientation of the X'Z' plane with respect to the XZ plane. Together, θ and ϕ, uniquely define the orientation of the x-ray illumination beam 117 with respect to the surface of wafer 101. In this example, the orientation of the x-ray illumination beam with respect to the surface of wafer 101 is described by a rotation about an axis normal to the surface of wafer 101 (i.e., Z axis) and a rotation about an axis aligned with the surface of wafer 101 (i.e., Y' axis). In some other examples, the orientation of the x-ray illumination beam with respect to the surface of wafer 101 is described by a rotation about a first axis aligned with the surface of wafer 101 and another axis aligned with the surface of wafer 101 and perpendicular to the first axis as described with reference to FIG. 1.

In a further aspect, an x-ray scatterometry system is employed to determine properties of a specimen (e.g., structural parameter values) based on one or more measured diffraction orders. As depicted in FIG. 1, metrology tool 100 includes a computing system 130 employed to acquire signals 126 generated by detector 116 in accordance with a robust measurement recipe and determine properties of the specimen based at least in part on the acquired signals.

Figure 4:
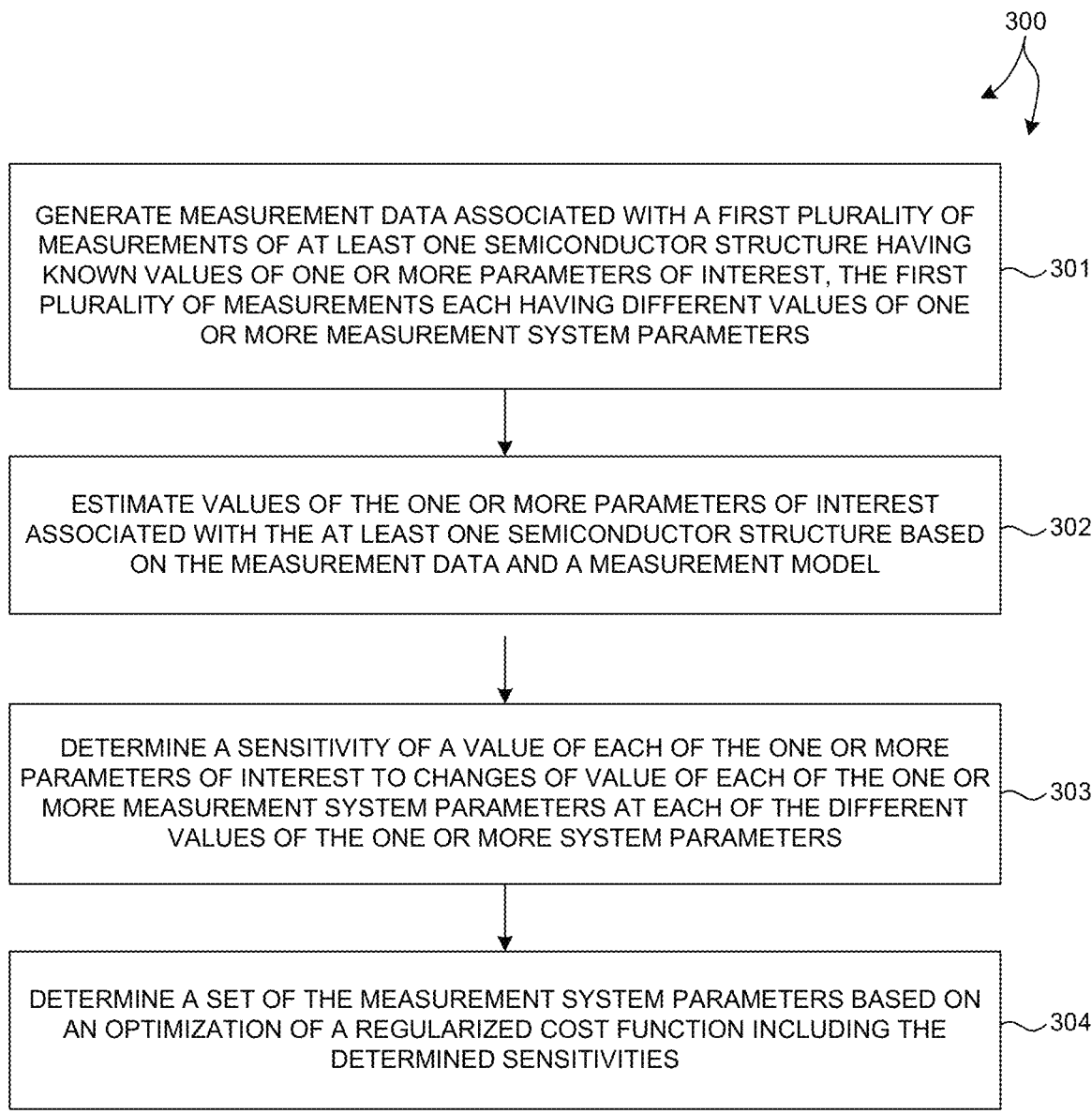
FIG. 4 depicts a flowchart illustrative of an exemplary method 300 of measurement recipe optimization as described herein.

FIG. 4 illustrates a method 300 suitable for implementation by the metrology systems 100 and 200 of the present invention. In one aspect, it is recognized that data processing blocks of method 300 may be carried out via a pre-programmed algorithm executed by one or more processors of computing system 130. While the following description is presented in the context of metrology systems 100 and 200, it is recognized herein that the particular structural aspects of metrology systems 100 and 200 do not represent limitations and should be interpreted as illustrative only.

In block 301, measurement data associated with a first plurality of measurements of at least one semiconductor structure having known values of one or more parameters of interest is generated. The first plurality of measurements each have different values of one or more measurement system parameters.

In preferred embodiments, measurement signals are predicted by electromagnetic simulations. In these embodiments, simulated measurement signals are generated based on a geometric model of a measured structure characterized by one or more parameters of interest, e.g., critical dimension, height, etc.

In some examples, the measurement system parameters include any combination of different illumination angles (e.g., angles of incidence and azimuth angles), different detector resolution, different exposure time, different target size, different source size, different collected energy, or any combination thereof.

In block 302, values of the one or more parameters of interest associated with the at least one semiconductor structure are estimated based on the measurement data and a measurement model.

In some embodiments, a value of a parameter of interest (e.g., critical dimension, sidewall angle, height, overlay, etc.) is estimated based on the measurement data using an inverse solve technique such as model based regression, ptychography, tomography, one or more machine learning models, or a combination thereof.

In some of these embodiments, values of the one or more parameters of interest are determined by an inverse solution of a pre-determined measurement model with the measurement data. The measurement model includes a few (on the order of ten) adjustable parameters and is representative of the geometry and optical properties of the specimen and the optical properties of the measurement system. In this manner, target profile parameters are estimated by solving for values of a parameterized measurement model that minimize errors between the measured scattered x-ray intensities and modeled results.

In a further aspect, computing system 130 is configured to generate a structural model (e.g., geometric model, material model, or combined geometric and material model) of a measured structure of a specimen, generate a x-ray scatterometry response model that includes at least one geometric parameter from the structural model, and resolve at least one specimen parameter value by performing a fitting analysis of x-ray scatterometry measurement data with the x-ray scatterometry response model. The analysis engine is used to compare the simulated x-ray scatterometry signals with measured data thereby allowing the determination of geometric as well as material properties such as electron density of the sample. In the embodiment depicted in FIG. 1, computing system 130 is configured as a model building and analysis engine configured to implement model building and analysis functionality as described herein.

Figure 5:
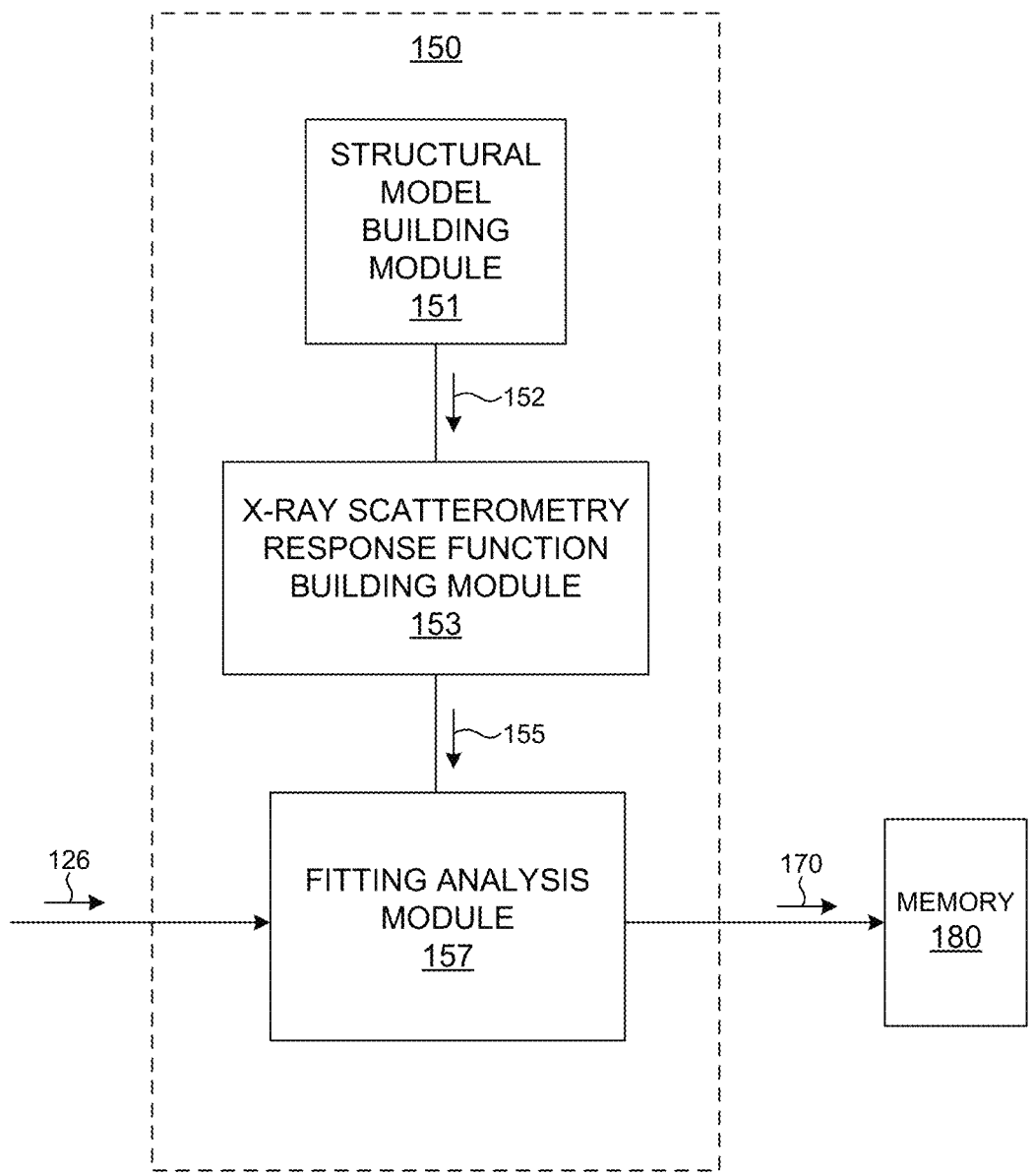
FIG. 5 is a diagram illustrative of a model building and analysis engine 150 configured to resolve specimen parameter values based on x-ray scatterometry data in accordance with the methods described herein.

FIG. 5 is a diagram illustrative of an exemplary model building and analysis engine 150 implemented by computing system 130. As depicted in FIG. 5, model building and analysis engine 150 includes a structural model building module 151 that generates a structural model 152 of a measured structure of a specimen. In some embodiments, structural model 152 also includes material properties of the specimen. The structural model 152 is received as input to x-ray scatterometry response function building module 153. x-ray scatterometry response function building module 153 generates a x-ray scatterometry response function model 155 based at least in part on the structural model 152. In some examples, the x-ray scatterometry response function model 155 is based on x-ray form factors, $$F(\vec{q}) = \int \rho(\vec{r}) e^{-i\vec{q}\cdot\vec{r}} d\vec{r} \quad (2)$$

where F is the form factor, q is the scattering vector, and $\rho(r)$ is the electron density of the specimen in spherical coordinates. The x-ray scattering intensity is then given by $$I(\vec{q}) = F^*F. \quad (3)$$

X-ray scatterometry response function model 155 is received as input to fitting analysis module 157. The fitting analysis module 157 compares the modeled x-ray scatterometry response with the corresponding measured data 126 to determine geometric as well as material properties of the specimen.

In some examples, the fitting of modeled data to experimental data is achieved by minimizing a chi-squared value. For example, for x-ray scatterometry measurements, a chi-squared value can be defined as $$\chi^2_{SAXS} = \frac{1}{N_{SAXS}} \sum_i^{N_{SAXS}} \frac{(S_j^{SAXS.\ model}(v_1,\ldots,v_L) - s_j^{SAXS\ experiment})^2}{\sigma^2_{SAXS,j}} \quad (4)$$

Where, $S_j^{SAXS\ experiment}$ is the measured x-ray scatterometry signals 126 in the "channel" j, where the index j describes a set of system parameters such as diffraction order, energy, angular coordinate, etc. $S_j^{SAXS\ model}(v_1,\ldots,v_L)$ is the modeled x-ray scatterometry signal $S_j$ for the "channel" j, evaluated for a set of structure (target) parameters $v_1,\ldots,v_L$, where these parameters describe geometric (CD, sidewall angle, overlay, etc.) and material (electron density, etc.). $\sigma_{SAXS,j}$ is the uncertainty associated with the jth channel. $N_{SAXS}$ is the total number of channels in the x-ray metrology. L is the number of parameters characterizing the metrology target.

Equation (4) assumes that the uncertainties associated with different channels are uncorrelated. In examples where the uncertainties associated with the different channels are correlated, a covariance between the uncertainties, can be calculated. In these examples a chi-squared value for x-ray scatterometry measurements can be expressed as $$\chi^2_{SAXS} = \frac{1}{N_{SAXS}} \left( \vec{S}_j^{SAXS.\ model}(v_1,\ldots,v_M) - \vec{S}_j^{SAXS.\ experiment} \right)^T$$

$$V_{SAXS}^{-1} \left( S_j^{SAXS.\ model}(v_1,\ldots,v_M) - \vec{S}_j^{SAXS.\ experiment} \right) \quad (5)$$

where, $V_{SAXS}$ is the covariance matrix of the SAXS channel uncertainties, and T denotes the transpose.

In some examples, fitting analysis module 157 resolves at least one specimen parameter value by performing a fitting analysis on x-ray scatterometry measurement data 126 with the x-ray scatterometry response model 155. In some examples, $\chi_{SAXS}^2$ is optimized.

As described hereinbefore, the fitting of x-ray scatterometry data is achieved by minimization of chi-squared values. However, in general, the fitting of x-ray scatterometry data may be achieved by other functions.

The fitting of x-ray scatterometry metrology data is advantageous for any type of x-ray scatterometry technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing x-ray scatterometry beam interaction with the specimen are used.

In general, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In some examples, model building and analysis engine 150 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In block 303, a sensitivity of a value of each of the one or more parameters of interest to changes of value of each of the one or more measurement system parameters is determined at each of the different values of the one or more system parameters.

In some embodiments, a Jacobian matrix quantifies the sensitivity of an estimated value of a parameter of interest to different measurement system parameter values, e.g., measurement time, angle of incidence, azimuth angle, etc.

In block 304, a set of measurement system parameter values is determined based on an optimization of a regularized cost function including the determined sensitivities.

The optimized set of measurement system parameter values describes a sequence of measurements of a semiconductor structure by a metrology system at each of the one or more measurement sites. Each measurement of the sequence of measurements is characterized by a different value of one or more metrology system parameters that define a configuration of the metrology system. In other words, the measurement system configuration (e.g., angle of incidence, divergence, azimuth angle, beam energy, integration time, etc., is different for each measurement of the sequence of measurements).

Possible measurement configurations are searched using, non-linear least squares, non-linear integer optimization, exhaustive search, simulated annealing, L1-norm regression, genetic search, trained models, etc. The trained models are based on decisions from previously listed methods, synthetic training sets, or actual results. In some embodiments, the Jacobian matrix is employed as part of the optimization to select a set of measurement system parameter values and associated measurement times to optimize a regularized measurement performance metric. In general, a measurement recipe is updated iteratively until the final measurement recipe minimizes the regularized measurement performance metric or the maximum time allowed for measurement recipe generation expires.

In some embodiments, regularization of the optimization cost function ensures measurement robustness to outliers and process excursions, while trading off any combination of measurement uncertainty, measurement time, move time, exposure time, exposure dosage, etc.

In one aspect, a regularized measurement recipe optimization cost function includes a regularization term characterizing the roughness of a curve expressing exposure time as a function of angle of incidence. Experience shows that a curve expressing a process variation such as exposure time, T, as a function of angle of incidence, AOI, e.g., T(AOI), should be smooth, i.e., negligible roughness. In one example, roughness is characterized by a normalized standard deviation of the second derivative of exposure time as a function of angle of incidence, T(AOI), as illustrated by equation (6).

$$\text{Roughness} = \frac{stdev\left(\frac{d^2 T(AOI)}{dAOI^2}\right)}{\text{mean}(T(AOI))} \quad (6)$$

In another aspect, a regularized measurement recipe optimization cost function includes a regularization term characterizing the asymmetry of a curve expressing exposure time as a function of angle of incidence. For CD-SAXS measurements, the resulting scattering intensity is at a maximum when the angle of incidence of the incidence measurement beam is aligned with the tilt angle of the structure under measurement. At this angle of incidence, the measured signals provide the greatest contribution to overall measurement precision and accuracy. Furthermore, process variation in tilt or overlay is equally likely to be realized on either side of the average tilt or overlay, respectively. Therefore, it is advantageous to favor measurement recipes that exhibit an exposure time distribution that is symmetric about the average geometry, e.g., average tilt angle, average overlay, etc. In these examples, a curve expressing a process variation such as exposure time, T, as a function of angle of incidence, AOI, e.g., T(AOI), should be symmetric. In one example, a regularization term characterizing asymmetry of exposure time as function of difference between the angle of incidence and the average tilt or overlay is illustrated by equation (7), where x is the average value of tilt or overlay. In general, the average value of tilt or overlay is known to a user of the metrology system based on process knowledge.

$$\text{Asymmetry} = \frac{\sum_{AOI} |T(AOI + x) - T(-AOI + x)|}{\text{mean}(T)} \quad (7)$$

Figure 6:
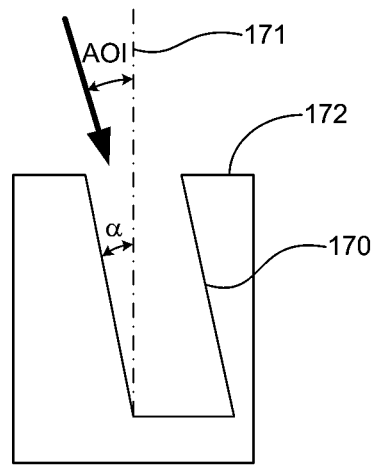
FIG. 6 is a diagram illustrative of another instance of a trench structure measured by a Transmission Small Angle X-Ray Scattering (T-SAXS) tool, such as metrology system 100.

FIG. 6 depicts a diagram illustrative of a cross-sectional view of a trench structure 170 to be measured by a Transmission Small Angle X-Ray Scattering (T-SAXS) tool, such as metrology system 100. As depicted in FIG. 6, the trench structure 170 is fabricated at a tilt angle, a, with respect to a surface normal 171 of a semiconductor wafer 172. In one example, the average tilt angle of a large number of samples is +1 degree. In this example, regularization employing the Asymmetry term illustrated by Equation (7) during measurement recipe optimization causes the optimization to favor measurement recipes exhibiting symmetry of the exposure time about an angle of incidence of +1 degree.

Figure 7:
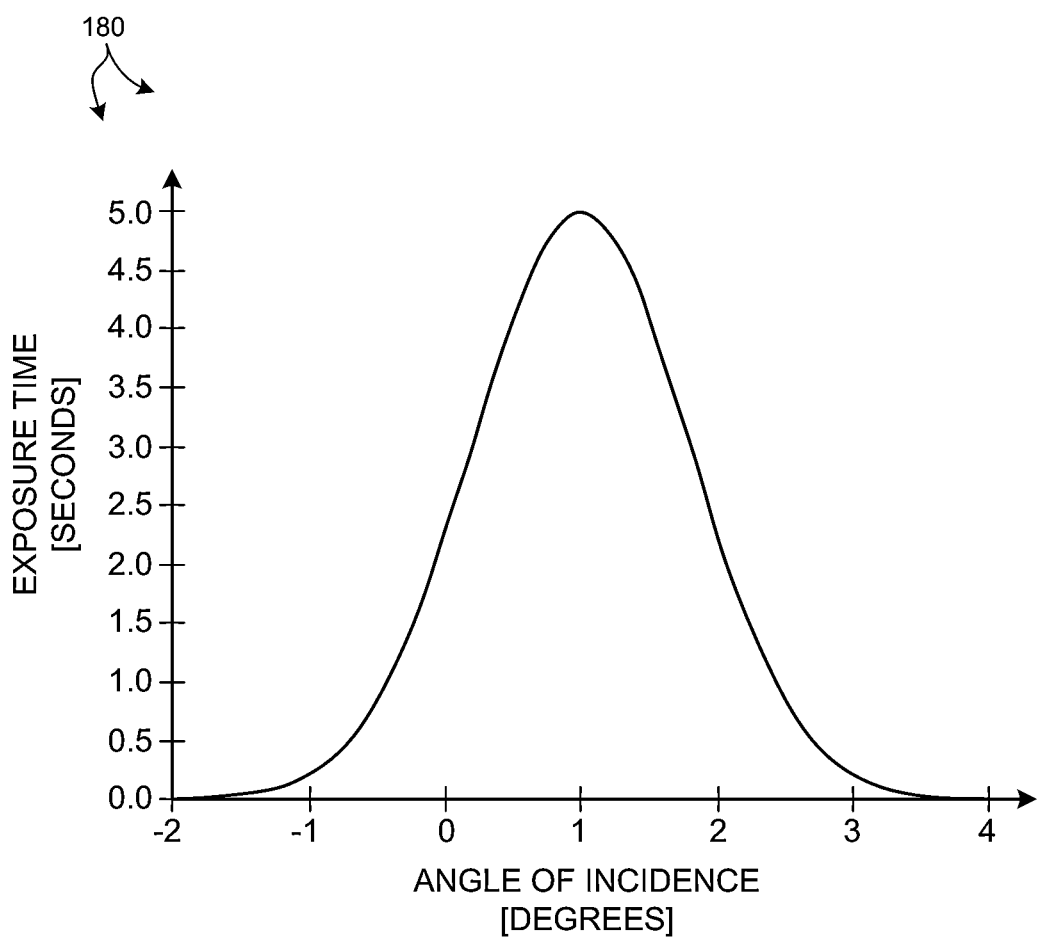
FIG. 7 depicts a plot 180 illustrative of exposure time as a function of angle of incidence for a measurement recipe.

FIG. 7 depicts a plot 180 illustrative of exposure time as a function of angle of incidence for a measurement recipe. As illustrated in FIG. 7, the measurement recipe exhibits symmetry of the exposure time about an angle of incidence of +1 degree.

In another example, the average tilt angle of a large number of samples is zero degrees. In this example, there is no expected tilt, and regularization employing the Asymmetry term illustrated by Equation (7) during measurement recipe optimization causes the optimization to favor measurement recipes exhibiting symmetry of the exposure time about an angle of incidence of zero degrees.

In another aspect, a regularized measurement recipe optimization cost function includes a regularization term characterizing differences between a current measurement recipe and a reference measurement recipe. In one example, a regularization term characterizing the difference between a current measurement recipe and a reference measurement recipe is illustrated by Equation (8), where T(AOI) is the exposure time as a function of angle of incidence associated with the current measurement recipe, and $T_{ref}(AOI)$ is the exposure time as a function of angle of incidence associated with the reference measurement recipe.). In this manner, the regularization term illustrated by Equation (8) penalizes the cost function based on how much the current measurement recipe differs from the reference recipe.

$$\text{DifferenceFromReferenceRecipe} = \frac{\sum_{AOI} |T(AOI) - T_{ref}(AOI)|}{\text{mean}(T(AOI))} \quad (8)$$

In some examples, a reference measurement recipe is a measurement recipe that worked well in the past for measurements of the same type of geometry, e.g., channel hole, word line cut, DRAM, etc., measured by the same type of metrology system. It makes sense that an optimized measurement recipe associated with a measurement of the same type of geometry by the same type of metrology system should not differ greatly from the reference measurement recipe.

In some examples, a reference measurement recipe is synthesized by analyzing the sensitivity of one or more measurement system parameters to an estimated value of a parameter of interest. In some examples, values of angles of incidence, azimuth angles, or both, having low sensitivity to a parameter of interest are excluded from the reference measurement recipe.

In some other examples, a reference measurement recipe is synthesized by analyzing the correlation of an estimated parameter of interest over a range of measurement system parameters and excluding a subset of the range of measurement system parameters that are highly correlated. Highly correlated signals are not likely to contribute to a minimization of performance cost function metrics such as precision or accuracy. Thus, the subset is eliminated to reduce the space of measurement system parameters sampled by the reference measurement recipe.

In some other examples, a reference measurement recipe is synthesized by analyzing the correlation of a measurement system parameter to the other measurement system parameters and constraining a subset of the measurement system parameters that are highly correlated. Highly correlated measurement system parameters are likely redundant and their values should be fixed absolutely or constrained to the value of another measurement system parameter value to reduce the space of measurement system parameters sampled by the reference measurement recipe.

In some other examples, a reference measurement recipe is synthesized by performing measurement optimization without regularization over a range of measurement system parameters, e.g., pairs of different values of angle of incidence and azimuth angle.

In some other examples, a reference measurement recipe is synthesized based on existing measurement process knowledge. For example, for measurements of line cut structures, the preferred azimuth angle is normal to the cut to better capture the shape of the sidewalls of the channel. In this example, all other azimuth angles are excluded to reduce the space of measurement system parameters sampled by the reference measurement recipe.

In another aspect, a regularized measurement recipe optimization cost function includes a regularization term characterizing differences between a current value of a measurement system parameter prescribed by the current measurement recipe and a reference measurement system parameter value. In one example, it is known that x-ray scatterometry based measurements of relatively short structures are more sensitive at angles of incidence away from normal incidence. The amount of material subject to x-ray transmission, and thus the scattering strength greatly increases away from normal incidence for relatively short structures. Conversely, x-ray scatterometry based measurements of relatively tall structures are more sensitive at angles of incidence near normal incidence.

In one example, a regularization term characterizing the distance from a zero angle of incidence is illustrated by Equation (9), where C is a positive constant provided by a user. The greater the value of constant, C, the greater the strength of the regularization. The value of C is selected to be relatively large for tall structures and relatively small, or zero, for short structures. In this manner, the regularization term illustrated by Equation (9) penalizes the cost function based on how much the current value of angle of incidence prescribed by the current measurement recipe differs from zero, i.e., normal incidence.

$$\text{DistanceFromZero} = \frac{\sum_{AOI} CT(AOI) \text{abs}(AOI)}{\text{mean}(T(AOI))} \quad (9)$$

In one example, regularization of a cost function includes minimization of asymmetry and roughness of the exposure time versus AOI curves. The optimization penalizes the cost function by the amount of roughness and asymmetry at each iteration of the measurement recipe. A smooth and symmetric distribution of exposure time as a function of angle of incidence is suitable for a broad range of measurement samples and mitigates overemphasis of certain measurement sites over others during recipe optimization.

In some examples, each regularization component is weighted relative to the unregularized cost function components as illustrated by equation (8), where $w_1$ and $w_2$ are weighting values.

$$\text{Regularized cost function} = \quad (8)$$
$$\text{Unregularized cost function} + w_1 \text{Roughness} + w_2 \text{Asymmetry}$$

The weighting values are typically selected by a user. The unregularized cost function typically expresses performance metrics that quantify measurement precision, accuracy, etc.

In general, a regularized cost function may include any number of regularization terms, e.g., any combination of the regularization terms described herein.

In a further aspect, regularized measurement recipe optimization is performed based on measurement data associated with multiple instances of a semiconductor structure each characterized a different value of one or more geometric parameters of interest. In this manner, the measurement data includes measurements of the semiconductor structure at multiple different nominal values of the geometric parameters characterizing the geometry of the structure.

In some embodiments, the value of a regularized cost function associated with a measurement recipe optimization is determined for each instance of the semiconductor structure. The resulting values of the regularized cost function are averaged, and the average value of the regularized cost function is employed to drive the next iteration of the measurement recipe. By averaging the values of the regularized cost function associated with a range of different instances of a semiconductor structure performance, the optimized measurement recipe is more robust to variations of the geometry of the structure under measurement.

In general, a regularization term may be synthesized and employed as an element of the cost function of a measurement recipe optimization based on any known characteristics of the structure under measurement including, but not limited to, symmetry, optical density, height, and class of the structure. In addition, a regularization term may be synthesized and employed as an element of the cost function of a measurement recipe optimization based on the particular parameter of interest, e.g., CD, tilt, etc.

In a further aspect, the search for optimized measurement recipes is limited to the discrete set of measurement system parameter values associated with the available measurement data set. Thus, an optimized measurement recipe is a discrete subset of the measurement system parameter values associated with the available measurement data set. In this manner, the performance of a particular measurement recipe can be validated using existing measurement data. In some embodiments, the measurement recipe optimization is performed using non-linear integer optimization, rather than a continuous optimization to directly operate on the discrete set of measurement system parameter values.

In some embodiments, an optimized measurement recipe is synthesized without adjustment of exposure time associated with each measurement of the available measurement data set. In these embodiments, a particular combination of measurement system parameters, e.g., AOI, AZ, etc. is either considered part of an optimized measurement recipe at the full exposure time considered in the measurement data set or not considered part of the optimized measurement recipe at all. In other words, the exposure time associated with a particular measurement included in a measurement recipe is not changed compared to the exposure time associated with the particular measurement in the available measurement data set. In these embodiments, an optimized measurement recipe is validated by removing measurement signals entirely from the available measurement data set, performing regression on a measurement model with the measurement data associated with the optimized recipe, and confirming the resulting measurement performance, e.g., measurement precision, accuracy, etc.

In some other embodiments, an optimized measurement recipe is synthesized with discrete adjustment of exposure time associated with each measurement of the available measurement data set. In these embodiments, the exposure time associated with a particular measurement included in a measurement recipe may be a discrete subset of the exposure time associated with the particular measurement in the available measurement data set. In one example, each particular measurement is performed as a sequence of frames, e.g., sequence of several frames of three seconds each. In this example, an optimized measurement recipe may include a subset of the available frames associated with each measurement of the available measurement data set. In these embodiments, an optimized measurement recipe is validated by removing particular frames from measurement signals of the available measurement data set, performing regression on a measurement model with the measurement data associated with the optimized recipe, and confirming the resulting measurement performance, e.g., measurement precision, accuracy, etc.

In another further aspect, an optimized measurement recipe is determined based on a search of a library of candidate measurement recipes.

In one example, the value of a regularized cost function as described herein is evaluated for each measurement recipe of a library of past measurement recipes. The measurement recipe associated with the minimum value of the regularized cost function is selected as the optimal measurement recipe, or alternatively as an initial measurement recipe that is further optimized in an iterative manner using the regularized cost function.

In another further aspect, the measurement uncertainty associated with a measurement of one or more parameters of interest in accordance with an optimized measurement recipe (i.e., the set of measurement system settings prescribed by the optimized measurement recipe) is evaluated to validate the measurement recipe. In general, an optimized measurement recipe may be validated based on measured data, simulated data, or both.

In some examples, a Jacobian matrix quantifies a change in estimated value of a parameter of interest in response to random or systematic measurement system errors. In these examples, a Jacobian matrix is employed to estimate the achievable measurement precision, accuracy, or both, in light of expected measurement system errors.

In some other examples, a machine learning based model is employed to estimate the measurement uncertainty associated with a measurement of one or more parameters of interest in accordance with an optimized measurement recipe.

In some other examples, model based regression is employed to estimate the measurement uncertainty associated with a measurement of one or more parameters of interest in accordance with an optimized measurement recipe.

In some examples, a set of measurements of a semiconductor structure by a metrology system includes measurements of one or more different target parameters (e.g., MCD, BCD, OVL, SWA, etc.). In this manner, the optimization of the measurement recipe includes a selection of one or more target parameters associated with a particular semiconductor structure that provide a better estimate of the parameter of interest (e.g., CD).

Regularized measurement recipe optimization as described herein may be performed on any number of different metrology systems, such as, but not limited to, x-ray transmission tools, x-ray reflection tools, infrared transmission tools, etc.

In a further aspect, x-ray scatterometry measurements are performed in accordance with a measurement recipe optimized as described herein over a range of angles of incidence that provide sufficient resolution and depth of penetration to characterize high aspect ratio structures through their entire depth.

In a further aspect, an optimized measurement recipe is implemented on a metrology system by communicating control commands that result in changes in state of one or more elements of the metrology system to implement the optimized measurement recipe.

In some examples, the control commands are provided to the illumination source. In response, the electrical state of the illumination source is adjusted to change the scanned spot size and shape, illumination power, spot offsets, incident angles, etc.

In some examples, the control commands are provided to one or more positioning devices that control the location of one or more optical elements of the metrology system. In response, the one or more positioning devices changes a position/orientation of one or more optical elements to adjust the incidence angles, focal distance between the illumination source and illumination optics, beam positioning, location of the beam spot on the optic to minimize the effects of surface roughness, etc.

Metrology systems and techniques are employed to measure structural and material characteristics associated with different semiconductor fabrication processes. In some examples, optimized measurement recipes are employed for x-ray scatterometry measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM).

In some embodiments, x-ray detector 116 is maintained in the same atmospheric environment as specimen 101 (e.g., gas purge environment). However, in some embodiments, the distance between specimen 101 and x-ray detector 116 is lengthy and environmental disturbances (e.g., air turbulence) contribute noise to the detected signals. Hence in some embodiments, one or more of the x-ray detectors is maintained in a localized, vacuum environment separated from the specimen (e.g., specimen 101) by a vacuum window.

Similarly, in some embodiments, x-ray illumination source 110, illumination optics 115, or both, are maintained in the same atmospheric environment as specimen 101 (e.g., gas purge environment). However, in some embodiments, the optical path length between x-ray illumination source 110 and illumination optics 115 and the optical path length between illumination optics 115 and specimen 101 are long and environmental disturbances (e.g., air turbulence) contribute noise to the illumination beam. Hence in some embodiments, the x-ray illumination source, the illumination optics 115, or both, are maintained in a localized, vacuum environment separated from the specimen (e.g., specimen 101) by a vacuum window.

Figure 8:
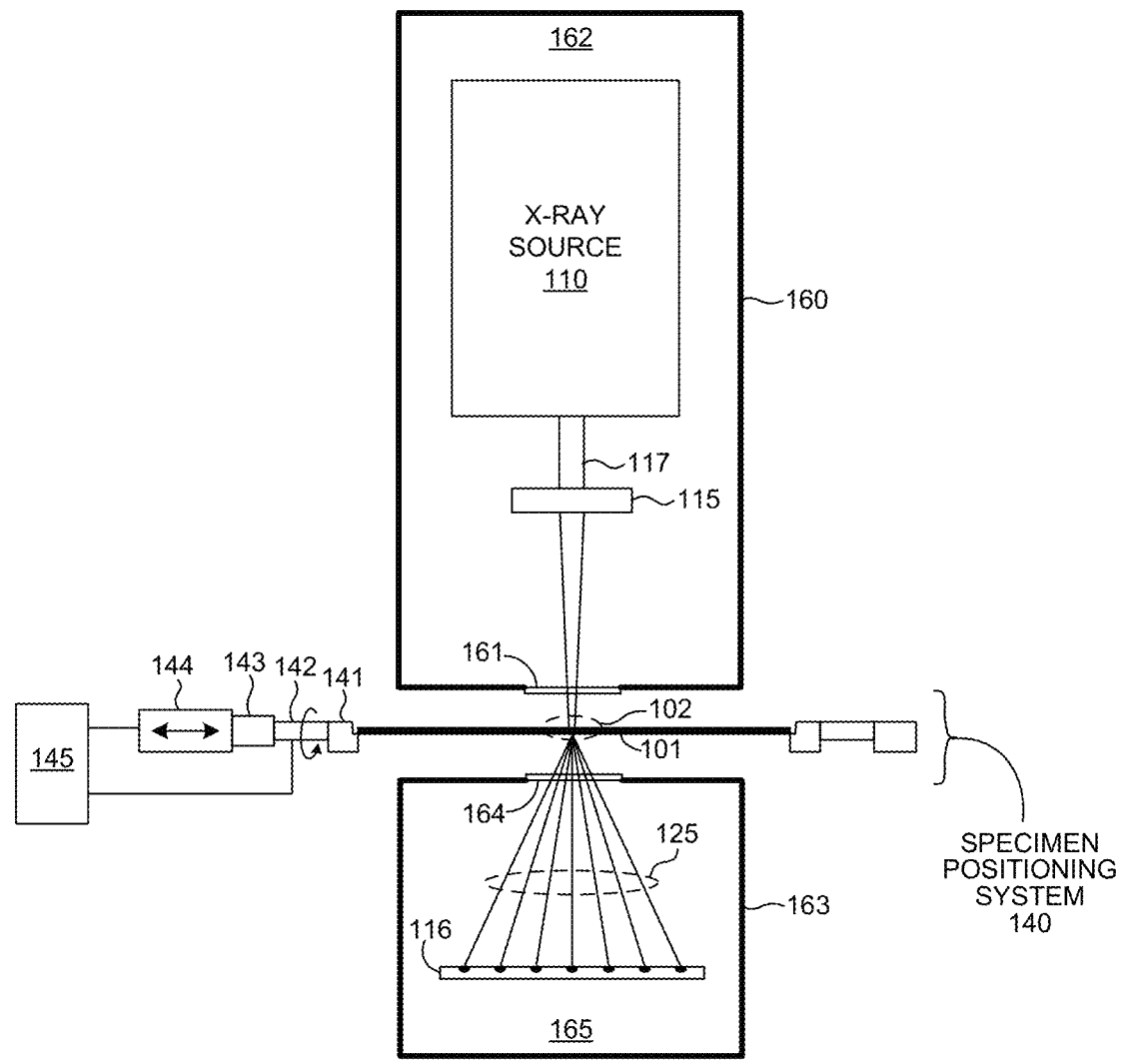
FIG. 8 is a diagram illustrative of elements of metrology systems 100 and 200 contained in vacuum environments separate from specimen 101.

FIG. 8 is a diagram illustrative of a vacuum chamber 160 containing x-ray illumination source 110 and illumination optics 115 and a vacuum chamber 160 containing x-ray detector 116 in one embodiment. In a preferred embodiment, vacuum chamber 160 includes a substantial portion of the optical path between x-ray illumination source 110 and specimen 101, and vacuum chamber 163 includes a substantial portion of the optical path between specimen 101 and x-ray detector 116. The openings of vacuum chamber 160 and vacuum chamber 163 are covered by vacuum windows 161 and 164, respectively. Vacuum windows 161 and 164 may be constructed of any suitable material that is substantially transparent to x-ray radiation (e.g., Beryllium). Illumination beam 117 passes through vacuum window 161 as it propagates toward specimen 101. After interaction with specimen 101, scattered x-ray radiation 125 passes through vacuum window 164, enters vacuum chamber 160 and is incident on x-ray detector 116. A suitable vacuum environment 162 is maintained within vacuum chamber 160 to minimize disturbances to the illumination beam 117, and a suitable vacuum environment 165 is maintained within vacuum chamber 163 to minimize disturbances to scattered x-ray radiation 125. A suitable vacuum environment may include any suitable level of vacuum, any suitable purged environment including an inert gas (e.g., helium), or any combination thereof. In this manner, as much of the beam path as possible is located in vacuum to maximize flux and minimize perturbations.

In some embodiments, the entire optical system, including specimen 101, is maintained in vacuum. However, in general, the costs associated with maintaining specimen 101 in vacuum are high due to the complexities associated with the construction of specimen positioning system 140.

In some embodiments, the metrology target characterized by x-ray scatterometry measurements as described herein is located within a scribe line of the wafer under measurement. In these embodiments, the metrology target is sized to fit within the width of the scribe line. In some examples, the scribe line width is less than eighty micrometers. In some examples, the scribe line is less than fifty micrometers. In general, the width of the scribe lines employed in semiconductor manufacturing is trending smaller.

In some embodiments, the metrology target characterized x-ray scatterometry measurements as described herein is located within an active die area of the wafer under measurement and is a part of a functional integrated circuit (e.g., memory, image sensor, logic device, etc.).

In general, a metrology target is characterized by an aspect ratio defined as a maximum height dimension (i.e., dimension normal to the wafer surface) divided by a maximum lateral extent dimension (i.e., dimension aligned with the wafer surface) of the metrology target. In some embodiments, the metrology target under measurement has an aspect ratio of at least twenty. In some embodiments, the metrology target has an aspect ratio of at least forty.

Figure 9A:
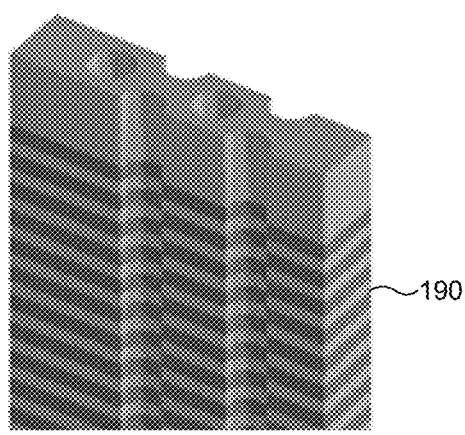
FIGS. 9A-9C depict an isometric view, a top view, and a cross-sectional view, respectively, of a typical 3D FLASH memory device 190 subject to measurement in the manner described herein.
Figure 9B:
Figure 9C:
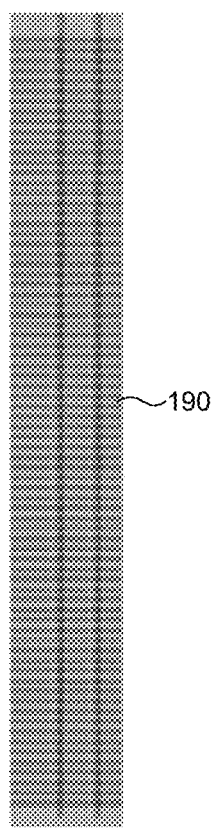

FIGS. 9A-9C depict an isometric view, a top view, and a cross-sectional view, respectively, of a typical 3D FLASH memory device 190 subject to measurement in the manner described herein. The total height (or equivalently depth) of memory device 190 ranges from one to several micrometers. Memory device 190 is a vertically manufactured device. A vertically manufactured device, such as memory device 190, essentially turns a conventional, planar memory device 90 degrees, orienting the bit line and cell string vertically (perpendicular to wafer surface). To provide sufficient memory capacity, a large number of alternating layers of different materials are deposited on the wafer. This requires patterning processes to perform well to depths of several microns for structures with a maximum lateral extent of one hundred nanometers or less. As a result, aspect ratios of 25 to 1 or 50 to 1 are not uncommon.

In general, the use of high brightness, x-ray scatterometry enables high flux x-ray radiation penetration into opaque areas of the target. Examples of measureable geometric parameters using x-ray scatterometry includes pore size, pore density, line edge roughness, line width roughness, side wall angle, profile, critical dimension, overlay, edge placement error, and pitch. An example of a measureable material parameter includes electron density. In some examples, x-ray scatterometry enables the measurement of features smaller than 10 nm as well as advanced semiconductor structures such as STT-RAM, V-NAND, DRAM, PC-RAM and Re-RAM, where measurements of geometrical parameters and material parameters are needed.

It should be recognized that the various steps described throughout the present disclosure may be carried out by a single computer system 130 or, alternatively, a multiple computer system 130. Moreover, different subsystems of the system 100, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the detector 116 and the illumination optics 115 in any manner known in the art. For example, the one or more computing systems 130 may be coupled to computing systems associated with the detector 116 and the illumination optics 115, respectively. In another example, any of the detector 116 and the illumination optics 115 may be controlled directly by a single computer system coupled to computer system 130.

The computer system 130 may be configured to receive and/or acquire data or information from the subsystems of the system (e.g., detector 116 and illumination optics 115, and the like) by a transmission medium that may include wireline and/or wireless portions. In this manner, the transmission medium may serve as a data link between the computer system 130 and other subsystems of the system 100.

Computer system 130 of the metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., signals 126) from a storage medium (i.e., memory 132 or 180) via a data link. For instance, spectral results obtained using a spectrometer of any of detector 116 may be stored in a permanent or semi-permanent memory device (e.g., memory 132 or 180). In this regard, the measurement results may be imported from on-board memory or from an external memory system. Moreover, the computer system 130 may send data to other systems via a transmission medium. For instance, specimen parameter values 170 determined by computer system 130 may be stored in a permanent or semi-permanent memory device (e.g., memory 180). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In some embodiments, an optimized measurement recipe as described herein is implemented as part of a fabrication process tool. Examples of fabrication process tools include, but are not limited to, lithographic exposure tools, film deposition tools, implant tools, and etch tools. In this manner, the results of an optimized measurement recipe are used to control a fabrication process. In one example, x-ray scatterometry measurement data collected from one or more targets is sent to a fabrication process tool. The x-ray scatterometry measurement data is analyzed as described herein and the results used to adjust the operation of the fabrication process tool.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, and material parameters such as electron density, composition, grain structure, morphology, stress, strain, and elemental identification.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
   generating measurement data associated with a first plurality of measurements of at least one semiconductor structure having known values of one or more parameters of interest, the first plurality of measurements each having different values of one or more measurement system parameters;
   estimating values of the one or more parameters of interest associated with the at least one semiconductor structure based on the measurement data and a measurement model;
   determining a sensitivity of a value of each of the one or more parameters of interest to changes of value of each of the one or more measurement system parameters at each of the different values of the one or more measurement system parameters; and
   determining an optimized set of values of the one or more measurement system parameters based on an optimization of a regularized cost function including the determined sensitivities.

2. The method of claim 1, wherein the regularized cost function includes a constraint on measurement time.

3. The method of claim 1, wherein the measurement data is simulated measurement data, actual measurement data, or both.

4. The method of claim 1, wherein the measurement data includes a plurality of instances of the at least one semiconductor structure, each of the plurality of instances having a different, known value of the one or more parameters of interest.

5. The method of claim 4, wherein a value of the regularized cost function associated with a measurement recipe is an average of values of the regularized cost function associated with each of the plurality of instances of the at least one semiconductor structure.

6. The method of claim 1, further comprising:
   determining a value of a measurement performance metric based on the optimized set of values of the one or more measurement system parameters.

7. The method of claim 1, wherein the one or more measurement system parameters includes azimuth angle, angle of incidence, and exposure time.

8. The method of claim 1, wherein the optimized set of values of the one or more measurement system parameters is a discrete subset of the different values of one or more measurement system parameters.

9. The method of claim 1, the regularized cost function includes a characterization of the at least one semiconductor structure.

10. The method of claim 9, wherein the characterization includes any of a symmetry of the at least one semiconductor structure, an optical density of the at least one semiconductor structure, a height of the at least one semiconductor structure, a structural class of the at least one semiconductor structure, or any combination thereof.

11. The method of claim 1, wherein the optimization of the regularized cost function involves a search through a library of candidate sets of measurement system parameters.

12. The method of claim 1, wherein the optimization is a non-linear integer optimization.

13. The method of claim 1, further comprising:
    validating measurement performance based on a regression test on synthetic measurement data or actual measurement data.

14. The method of claim 13, wherein the validating is based on the measurement data associated with the first plurality of measurements of the at least one semiconductor structure.

15. A system comprising:
    a metrology tool including an illumination source and a detector configured to collect a first amount of actual measurement data from measurements of one or more semiconductor structures disposed on a first wafer in accordance with a set of optimized measurement system parameter values; and
    a computing system configured to:
      generate measurement data associated with a first plurality of measurements of at least one semiconductor structure having known values of one or more parameters of interest, the first plurality of measurements each having different values of one or more measurement system parameters;
      estimate values of the one or more parameters of interest associated with the at least one semiconductor structure based on the measurement data and a measurement model;
      determine a sensitivity of a value of each of the one or more parameters of interest to changes of value of each of the one or more measurement system parameters at each of the different values of the one or more measurement system parameters; and determine the set of optimized measurement system parameter values based on an optimization of a regularized cost function including the determined sensitivities.

16. The system of claim 15, wherein the measurement data includes a plurality of instances of the at least one semiconductor structure, each of the plurality of instances having a different, known value of the one or more parameters of interest.

17. The system of claim 16, wherein a value of the regularized cost function associated with a measurement recipe is an average of values of the regularized cost function associated with each of the plurality of instances of the at least one semiconductor structure.

18. The system of claim 15, wherein the set of optimized measurement system parameter values is a discrete subset of the different values of one or more measurement system parameters.

19. The system of claim 18, wherein the optimization is a non-linear integer optimization.

20. The system of claim 15, wherein the regularized cost function includes a characterization of the at least one semiconductor structure.

21. The system of claim 20, wherein the characterization includes any of a symmetry of the at least one semiconductor structure, an optical density of the at least one semiconductor structure, a height of the at least one semiconductor structure, a structural class of the at least one semiconductor structure, or any combination thereof.

22. The system of claim 15, wherein the optimization of the regularized cost function involves a search through a library of candidate sets of measurement system parameters.

23. A system comprising:

a metrology tool including an illumination source and a detector configured to collect a first amount of actual measurement data from measurements of one or more semiconductor structures disposed on a first wafer in accordance with a set of optimized measurement system parameter values; and a non-transitory, computer-readable medium including instructions that when executed by one or more processors of a computing system cause the computing system to:

generate measurement data associated with a first plurality of measurements of at least one semiconductor structure having known values of one or more parameters of interest, the first plurality of measurements each having different values of one or more measurement system parameters;

estimate values of the one or more parameters of interest associated with the at least one semiconductor structure based on the measurement data and a measurement model;

determine a sensitivity of a value of each of the one or more parameters of interest to changes of value of each of the one or more measurement system parameters at each of the different values of the one or more measurement system parameters; and determine the set of optimized measurement system parameter values based on an optimization of a regularized cost function including the determined sensitivities.

* * * * *